United States Patent
Wang et al.

(10) Patent No.: US 9,379,742 B2
(45) Date of Patent: *Jun. 28, 2016

(54) RF TRANSMITTER, INTEGRATED CIRCUIT DEVICE, WIRELESS COMMUNICATION UNIT AND METHOD THEREFOR

(75) Inventors: Hua Wang, San Francisco, CA (US); Paul Cheng Po Liang, Hsinchu County (TW); Chun-Hsien Peng, Nantou County (TW); Ho-Chi Huang, Hsinchu County (TW)

(73) Assignee: Mediatek Singapore Pte. Ltd., Solaris (SG)

(*) Notice: Subject to any disclaimer, the term of this patent is extended or adjusted under 35 U.S.C. 154(b) by 341 days.

This patent is subject to a terminal disclaimer.

(21) Appl. No.: 13/351,209

(22) Filed: Jan. 16, 2012

(65) Prior Publication Data

US 2012/0269292 A1   Oct. 25, 2012

Related U.S. Application Data

(63) Continuation-in-part of application No. 13/298,282, filed on Nov. 16, 2011.

(60) Provisional application No. 61/477,684, filed on Apr. 21, 2011, provisional application No. 61/500,900, filed on Jun. 24, 2011.

(51) Int. Cl.
*H04L 25/49* (2006.01)
*H04B 1/04* (2006.01)
*H04L 27/36* (2006.01)

(52) U.S. Cl.
CPC ............ *H04B 1/0475* (2013.01); *H04L 27/368* (2013.01); *H04B 1/0483* (2013.01); *H04B 2001/0425* (2013.01)

(58) Field of Classification Search
CPC ............... H04B 1/0475; H04B 1/0483; H04B 2001/0425
See application file for complete search history.

(56) References Cited

U.S. PATENT DOCUMENTS

| 5,105,445 A | 4/1992 | Karam |
| 6,054,895 A * | 4/2000 | Danielsons ........... H03F 1/3241 330/149 |

(Continued)

FOREIGN PATENT DOCUMENTS

| CN | 1784879 A | 6/2006 |
| CN | 1819471 A | 8/2006 |

(Continued)

OTHER PUBLICATIONS

Alavi, M.S.; Staszewski, R.B.; de Vreede, L.C.N.; Visweswaran, A.; Long, J.R., "All-Digital RF Modulator," Microwave Theory and Techniques, IEEE Transactions on , vol. 60, No. 11, pp. 3513,3526, Nov. 2012.*

(Continued)

*Primary Examiner* — Ross Varndell
(74) *Attorney, Agent, or Firm* — Optimus Patents US, LLC

(57) ABSTRACT

A radio frequency (RF) transmitter including at least one digital signal processing module is described. The at least one digital signal processing module is arranged to receive a complex digital input signal, successively apply pre-distortion to the received complex digital input signal with a progressively finer granularity, simultaneously progressively increase a sampling rate of the received complex digital input signal, and output a first, in-phase digital control word and a second, quadrature, digital control word for controlling at least one digital power amplifier component to generate an RF signal representative of the received complex digital input signal.

16 Claims, 9 Drawing Sheets

(56) References Cited

U.S. PATENT DOCUMENTS

| | | | |
|---|---|---|---|
| 6,298,097 B1* | 10/2001 | Shalom | 375/297 |
| 6,697,436 B1 | 2/2004 | Wright | |
| 6,937,175 B1 | 8/2005 | Cruz-Albrecht | |
| 7,158,582 B2 | 1/2007 | Gamm | |
| 7,382,835 B2 | 6/2008 | Anvari | |
| 7,724,839 B2 | 5/2010 | Chen | |
| 7,826,553 B2 | 11/2010 | Chen | |
| 7,889,811 B2 | 2/2011 | Byun | |
| 2001/0050592 A1* | 12/2001 | Wright et al. | 330/2 |
| 2002/0085647 A1 | 7/2002 | Oishi | |
| 2003/0035494 A1 | 2/2003 | Bauder | |
| 2003/0179830 A1 | 9/2003 | Eidson | |
| 2004/0124916 A1 | 7/2004 | Kontson | |
| 2006/0119493 A1 | 6/2006 | Tal | |
| 2006/0291589 A1 | 12/2006 | Eliezer | |
| 2007/0049219 A1 | 3/2007 | Demir | |
| 2007/0190952 A1 | 8/2007 | Waheed | |
| 2008/0002788 A1 | 1/2008 | Akhtar | |
| 2008/0075194 A1 | 3/2008 | Ravi | |
| 2008/0187035 A1 | 8/2008 | Nakamura | |
| 2009/0004981 A1 | 1/2009 | Eliezer | |
| 2009/0051426 A1 | 2/2009 | Ba | |
| 2009/0054016 A1 | 2/2009 | Waheed | |
| 2009/0225903 A1 | 9/2009 | van Waasen | |
| 2010/0073084 A1 | 3/2010 | Hur | |
| 2010/0074367 A1 | 3/2010 | Kim | |
| 2010/0090745 A1 | 4/2010 | Kousai | |
| 2010/0105338 A1* | 4/2010 | Wang et al. | 455/73 |
| 2010/0127780 A1 | 5/2010 | An | |
| 2011/0058622 A1* | 3/2011 | Liang et al. | 375/286 |
| 2011/0080216 A1 | 4/2011 | Mujica | |
| 2011/0103508 A1 | 5/2011 | Mu | |
| 2011/0129037 A1 | 6/2011 | Staszewski | |
| 2011/0176636 A1 | 7/2011 | Wang | |
| 2011/0260797 A1 | 10/2011 | Lee | |

FOREIGN PATENT DOCUMENTS

| | | |
|---|---|---|
| CN | 101478514 A | 7/2009 |
| JP | 2007049621 A | 2/2007 |
| WO | 0025495 A1 | 5/2000 |
| WO | 0069065 A2 | 11/2000 |

OTHER PUBLICATIONS

Hsing-Hung Chen; Ching-Shyang Maa; Yeong-Cheng Wang, Y.-C.; Jiunn-Tsair Chen, "Joint polynomial and look-up-table power amplifier linearization scheme," Vehicular Technology Conference, 2003. VTC 2003-Spring. The 57th IEEE Semiannual , vol. 2, No., pp. 1345,1349 vol. 2, Apr. 22-25, 2003.*

Alavi, M.S.; Visweswaran, A.; Staszewski, R.B.; de Vreede, L.C.N.; Long, J.R.; Akhnoukh, A., "A 2-GHz digital I/Q modulator in 65-nm CMOS," Solid State Circuits Conference (A-SSCC), 2011 IEEE Asian , vol., No., pp. 277,280, Nov. 14-16, 2011.*

"International Search Report" mailed on Oct. 4, 2012 for International application No. PCT/CN2012/077358, International filing date: Jun. 21, 2012.

"International Search Report" mailed on Jul. 5, 2012 for International application No. PCT/CN2012/073413, International filing date:Mar. 31, 2012.

Robert Bogdan Staszewski, "All-Digital PLL and Transmitter for Mobile Phones", IEEE Journal of Solid-State Circuits, vol. 40, No. 12, Dec. 2005.

Mohammad. E. Heidari et al., "All-digital out-phasing modulator for a software-defined transmitter", 2008.

Debopriyo Chowdhury et al., "A 2.4GHz mixed-signal polar power amplifier with low-power integrated filtering in 65nm CMOS", 2010.

Calogero D. Presti et al., "A 25 dBm digitally modulated CMOS power amplifier for WCDMA/EDGE/OFDM with adaptive digital predistortion and efficient power control", 2009.

Petri Eloranta et al., "A multimode transmitter in 0.13 um CMOS using direct-digital RF modulator", IEEE Journal of Solid-State Circuits, vol. 42, No. 12, Dec. 2007.

Jaimin Mehta et al., "A 0.8mm2 All-Digital SAW-Less Polar Transmitter in 65nm EDGE SoC", ISSCC, p. 58-59, Figure 3.2.7, 2010.

Edward Gebara et al., "Integrated CMOS PA Technology for Cellular Digital Radios", Feb. 18, 2009.

Hyun H. Boo et al., "Adaptive Predistortion Using a Delta-Sigma Modulator for Automatic Inversion of Power Amplifier Nonlinearity", 2009.

"International Search Report" mailed on May 17, 2012 for International application No. PCT/CN2012/071661, International filing date:Feb. 27, 2012.

Zhiming Deng et al., Title: PA Cell, PA Module, Wireless Communication Unit, RF Transmitter Architecture and Method Therefor , pending U.S. Appl. No. 14/280,672, filed May 19, 2014.

Cruise et al., "A Digital-to-RF-Amplitude Converter for GSM/GPRS/EDGE in 90-nm Digital CMOS", Jun. 2005, pp. 21-24, Radio Frequency integrated Circuits (RFIC) Symposium, IEEE.

Pere Lluis Gilabert Pinal, "Multi Look-Up Table Digital Predistortion for RF Power Amplifier Linearization," Dec. 2007, Chapter 5, Ph.D. Thesis, Control Monitoring and Communications Group, Department of Signal Theory and Communications, Universitat Politècnica de Catalunya, Barcelona.

Morteza S. Alavi, Akshay Visweswaran, Robert B. Staszewski, Leo C.N de Vreede, John R. Long, Atef Akhnoukh, "A 2-GHz Digital I/Q Modulator in 65-nm CMOS", Delft University of Technology, The Netherlands, IEEE Asian Solid-State Circuits Conference, Nov. 14-16, 2011, Jeju, Korea, 2011 IEEE, p. 277~280.

Hsin-Hung Chen, Chih-Hung Lin, Po-Chiun Huang, and Jiunn-Tsair Chen, "Joint Polynomial and Look-Up-Table Predistortion Power Amplifier Linearization", National Tsing Hua University, Taiwan, IEEE Transactions on circuits and systems_II: Express briefs, vol. 53, No. 8, Aug. 2006, 2006 IEEE, p. 612-616.

Morteza S. Alavi, Robert Bogdan Staszewski, Leo C. N. de Vreede, Akshay Visweswaran, and John R. Long, "All-Digital RF I/Q Modulator", Delft University of Technology, The Netherlands, IEEE Transactions on microwave theory and techniques, vol. 60, No. 11, Nov. 2012, 2012 IEEE, p. 3513~3526.

* cited by examiner

RF TRANSMITTER, INTEGRATED CIRCUIT DEVICE, WIRELESS COMMUNICATION UNIT AND METHOD THEREFOR

CROSS REFERENCE TO RELATED APPLICATIONS

This is continuation-in-part (CIP) of co-pending U.S. non-provisional application Ser. No. 13/298,282 (filed on Nov. 16, 2011), and claims the benefit of U.S. provisional application No. 61/477,684 (filed on Apr. 21, 2011), U.S. provisional application No. 61/500,900 (filed on Jun. 24, 2011), and U.S. non-provisional application Ser. No. 13/298,282 (filed on Nov. 16, 2011), which claims the benefit of U.S. provisional application No. 61/477,684 and U.S. provisional application No. 61/500,900. The entire contents of these related applications are incorporated herein by reference.

BACKGROUND OF THE INVENTION

1. Field of the Invention

The field of this invention relates to a radio frequency transmitter, an integrated circuit device, a wireless communication unit and a method therefor. The invention is applicable to, but not limited to, a method and apparatus for generating a radio frequency signal for transmission over a radio frequency (RF) interface.

2. Description of the Prior Art

Advances in the deep sub-micron CMOS (Complimentary Metal-Oxide Semiconductor) process have lead to digital circuits becoming smaller and more power efficient. However, analog circuits do not scale well with the deep sub-micron CMOS process. It is therefore desirable for devices, such as radio frequency (RF) transmitters, to remove as many analog components as possible with the assistance of digital signal processing algorithms.

Furthermore, conventional RF transmitters use linear power amplifiers. Accordingly, the power efficiency of such conventional RF transmitters is usually very low due to the low efficiency of the linear PAs used therein. Switch-mode PAs have very high efficiency in comparison, which make such switch-mode PAs an attractive alternative to conventional linear PAs within RF transmitters.

Thus, an RF transmitter that can utilize switch-mode PAs through the assistance of digital processing algorithms to reduce the size and improve power efficiency is highly desirable. However, switch-mode PAs normally exhibit a highly non-linear input-output relationship. Furthermore, to meet stringent co-existence requirements of various wireless standards, noise shaping techniques are required.

Digital polar transmitters are a type of known transmitter design that utilizes switch-mode PAs whilst also taking advantage of CMOS process technology. Accordingly, such digital polar transmitters are able to achieve high power efficiency, whilst requiring only a small area. However, a problem with these known transmitter designs is that, due to the inherent bandwidth expansion characteristics of the AM (amplitude modulation) and PM (phase modulation) signals in a polar architecture, they are only suitable for narrowband modulated signals.

Hybrid polar transmitter designs take advantage of two dimensional (in-phase/quadrature) modulation to enable wideband phase modulation to be achieved. However, a problem with such hybrid polar transmitters is that they suffer from both amplitude and phase quantization noise, thus requiring significant noise shaping.

In-phase/Quadrature (IQ) RF digital to analogue convert (DAC) based transmitters are also known, which combine the functionalities of a DAC and a mixer, with the output of the I/Q RF DAC being combined in the analogue (RF) domain. However, such transmitter designs require a linear PA, and direct I/Q RF digital to analogue conversion is less power efficient than a digital polar transmitter design.

Another known RF transmitter design utilizes adaptive pre-distortion within a feedback loop using a delta-sigma modulator for automatic inversion of power amplifier non-linearity. Such a design is simple and allows for the use of low-precision DACs. However, this design still comprises a generally conventional architecture, and so PA efficiency is low.

It is expected that digitally assisted/intensive RF transmitters will become increasingly desirable. However, the digital signal processing in an RF transmitter front-end is different than the digital signal processing in baseband applications since it is related to the RF frequency, and thus is usually required to run at high speeds and with small energy consumption, whilst also being limited to small circuit size. However digital algorithms are limited by the availability of circuit speed; therefore finding simple yet efficient and effective digital algorithms is crucial from the implementation point of view. In published literature currently available there are discussions on digital algorithms that operate at very high clock frequencies, such as four times the carrier frequency. However, such clock frequencies are in practice not implementable.

Thus, a need exists for an improved RF transmitter, and method of operation therefor.

SUMMARY OF THE INVENTION

Accordingly, the invention seeks to mitigate, alleviate or eliminate one or more of the above mentioned disadvantages singly or in any combination. Aspects of the invention provide a method for generating a radio frequency signal for transmission over a radio frequency interface.

According to a first aspect of the invention, there is provided a radio frequency (RF) transmitter comprising at least one digital signal processing module. The at least one digital signal processing module is arranged to receive a complex digital input signal, successively apply pre-distortion to the received complex digital input signal with a progressively finer granularity, simultaneously progressively increase a sampling rate of the received complex digital input signal, and output a first, in-phase, digital control word and a second, quadrature, digital control word for controlling at least one digital power amplifier component to generate an RF signal that is representative of the received complex digital input signal. For example, the at least one digital signal processing module may be arranged to successively apply two-dimensional pre-distortion to the received complex digital input signal with a progressively finer granularity.

Thus, in this manner, at least some of the processing of the complex digital input signal may be performed at lower circuit speeds, thereby enabling the power consumption required for such processing to be reduced, and simplifying algorithms required for finer granularity processing required to be performed at higher processing speeds, such as at an input data rate of the power amplifier module.

According to an optional feature of the invention, the at least one digital signal processing module may comprise a plurality of digital pre-distortion components arranged to sequentially apply pre-distortion to the received complex digital input signal with a progressively finer granularity as the sampling rate of the received complex digital input signal is simultaneously progressively increased.

For example, the at least one digital signal processing module may comprise a first digital pre-distortion component arranged to receive the complex digital input signal comprising a first sampling rate and two-dimensional pre-distortion profile information for the digital power amplifier and output at least an indication of a sub-set of the pre-distortion profile information for the digital power amplifier component to which the received complex digital input signal relates.

The at least one digital signal processing module may further comprise at least one further pre-distortion component arranged to receive the digital input signal comprising a sampling rate greater than that of a preceding pre-distortion component and an indication of a sub-set of the pre-distortion profile information for the digital power amplifier output by the preceding pre-distortion component, and output at least an indication of a reduced sub-set of the pre-distortion profile information for the digital power amplifier component to which the received complex digital input signal relates.

According to an optional feature of the invention, the at least one digital signal processing module may comprise a final pre-distortion component arranged to receive the digital input signal comprising a sampling rate greater than that of a preceding pre-distortion component and an indication of a sub-set of the pre-distortion profile information for the digital power amplifier output by the preceding pre-distortion component, and output an indication of a reduced sub-set of the pre-distortion profile information for the digital power amplifier component to which the received complex digital input signal relates comprising in-phase and quadrature digital control words for controlling at least one digital power amplifier component to generate an RF signal representative of the received complex digital input signal.

According to an optional feature of the invention, the at least one digital processing module may comprise at least one noise shaping component arranged to receive the digital input signal and at least one feedback signal from the at least one digital pre-distortion component, apply noise shaping to the digital input signal based at least partly on the at least one feedback signal, and output at least one noise shaped digital input signal.

According to an optional feature of the invention, the at least one digital pre-distortion component may be arranged to receive the at least one noise shaped digital input signal, perform two-dimensional non-uniform mapping of the at least one noise shaped digital input signal to the in-phase and quadrature digital control words, and to output the in-phase and quadrature digital control words for controlling the digital power amplifier component to generate an RF signal representative of the received complex digital input signal.

According to an optional feature of the invention, the at least one noise shaping component and the at least one digital pre-distortion component may form at least part of a delta sigma modulator. For example, the at least one digital signal processing module may comprise a local delta-sigma modulator comprising a final pre-distortion component for performing two-dimensional digital pre-distortion embedded therein.

According to an optional feature of the invention, each digital pre-distortion component may be arranged to receive the complex (in-phase/quadrature) digital input signal, identify a closest matching predefined vector for the received complex digital input signal within the two-dimensional pre-distortion profile, and map the identified predefined vector to the in-phase and quadrature digital control words to provide the indication of a reduced sub-set of the pre-distortion profile information for the digital power amplifier component to which the received complex digital input signal relates.

According to an optional feature of the invention, the pre-distortion profile may be at least partly based on an input/output relationship for the power amplifier module.

According to an optional feature of the invention, the signal processing module may further comprise at least one interpolation component operably coupled between sequential pre-distortion components, and arranged to receive at a first data rate indications of a sub-set of the pre-distortion profile information output by a preceding pre-distortion component to perform interpolation of the multiple indications of a sub-set of the pre-distortion profile information output by a preceding pre-distortion component, and output at an increased data rate an interpolated indication of a sub-set of the pre-distortion profile information to a successive pre-distortion component.

According to a second aspect of the invention, there is provided an integrated circuit device comprising at least one digital signal processing module arranged to receive a complex digital input signal; successively apply pre-distortion to the received complex digital input signal with a progressively finer granularity; simultaneously progressively increase a sampling rate of the received complex digital input signal; and output a first, in-phase digital control word and a second, quadrature, digital control word for controlling at least one digital power amplifier component to generate an RF signal representative of the received complex digital input signal.

According to a third aspect of the invention, there is provided a wireless communication unit comprising at least one digital signal processing module arranged to: receive a complex digital input signal; successively apply pre-distortion to the received complex digital input signal with a progressively finer granularity; simultaneously progressively increase a sampling rate of the received complex digital input signal; and output a first, in-phase digital control word and a second, quadrature, digital control word. The wireless communication unit further comprises at least one digital power amplifier component arranged to receive the first, in-phase digital control word and a second, quadrature, digital control word that control a generation of an RF signal representative of the received complex digital input signal.

According to a fourth aspect of the invention, there is provided a method of generating a radio frequency signal for transmission over a radio frequency (RF) interface. The method comprises receiving a complex digital input signal, successively applying pre-distortion to the received complex digital input signal with a progressively finer granularity, simultaneously progressively increasing a sampling rate of the received complex digital input signal, and outputting a first, in-phase, digital control word and a second, quadrature, digital control word for controlling at least one digital power amplifier component to generate an RF signal representative of the received complex digital input signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter for use within, say, a wireless telecommunication handset and adapted in accordance with some embodiments of the present invention. However, it will be appreciated that the inventive concept described herein is not limited to specific features of the illustrated example, and may equally be implemented within alternative applications.

Figure 1:
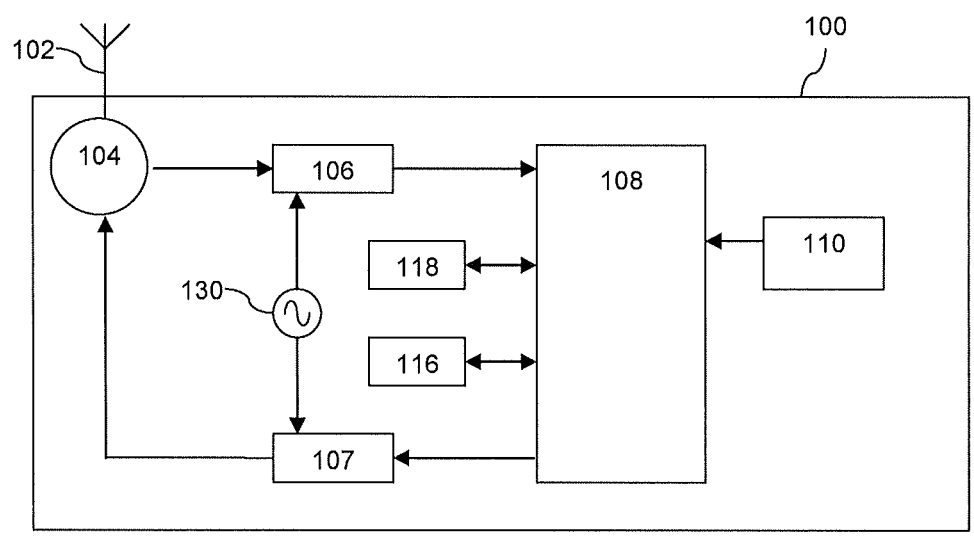
FIG. 1 illustrates an example of a simplified block diagram of part of an electronic device adapted to support the inventive concepts of an example of the present invention.

Referring first to FIG. 1, there is illustrated an example of a simplified block diagram of part of an electronic device 100 adapted to support the inventive concept of an example of the present invention. The electronic device 100, in the context of the illustrated embodiment of the invention, is a wireless telecommunication handset. As such, the electronic device 100 comprises an antenna 102 and contains a variety of well known radio frequency transceiver components or circuits operably coupled to the antenna 102. In particular for the illustrated example, the antenna 102 is operably coupled to a duplex filter or antenna switch 104 that provides isolation between a receiver chain 106 and a transmitter chain 107. As is known in the art, the receiver chain 106 typically includes radio frequency receiver circuitry for providing reception, filtering and intermediate or base-band frequency conversion. Conversely, the transmitter chain 107 typically includes radio frequency transmitter circuitry for providing modulation and power amplification. An oscillator 130 is arranged to provide oscillation signals needed by the receiver chain 106 and the transmitter chain 107.

For completeness, the electronic device 100 further comprises signal processing logic 108. An output from the signal processing logic 108 may be provided to a suitable user interface (UI) 110 comprising, for example, a display, keypad, microphone, speaker, etc. The signal processing logic 108 may also be coupled to a memory element 116 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 118 is typically coupled to the signal processing logic 108 to control the timing of operations within the electronic device 100.

As is well known in the art, the transmitter chain 107 of such a wireless telecommunication handset comprises transmitter circuitry arranged to receive an input signal, for example from, in the illustrated example, the signal processing logic 108; the input signal comprising information to be transmitted over an RF interface. The transmitter chain 107 is further arranged to output an RF signal comprising the information to be transmitted to, in the illustrated example, the antenna 102 via the antenna switch 104. As such, the transmitter chain 107 is typically required to perform digital to analogue conversion, mixing, noise shaping and amplification of the input signal in order to generate the RF signal output thereby.

Figure 2:
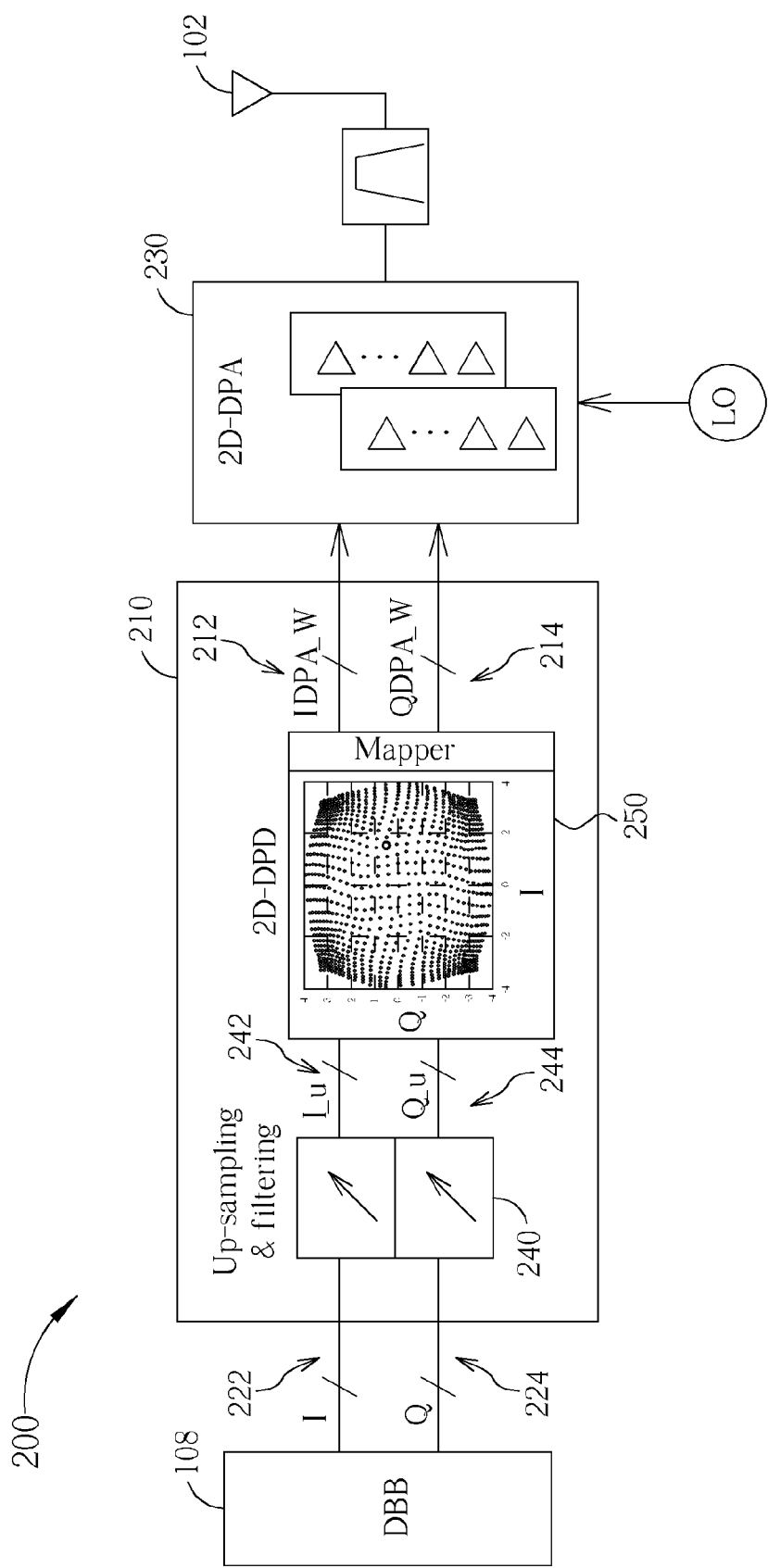
FIG. 2 illustrates a simplified block diagram of an example of a radio frequency transmitter.

Referring now to FIG. 2, there is illustrated an example of an RF transmitter 200, adapted in accordance with some example embodiments of the present invention, such as may be implemented within the transmitter chain 107 of FIG. 1. The RF transmitter 200 of FIG. 2 comprises a digital signal processing module 210 arranged to receive one or more complex input signals comprising information to be transmitted over an RF interface, for example via antenna 102 of FIG. 1. In the illustrated example, the digital signal processing module 210 is arranged to receive from a digital baseband (DBB) component, such as the signal processing logic 108 of FIG. 1, an IQ (In-phase/Quadrature) input signal comprising a first (In-phase) signal component (i.e., I) 222 and a second (Quadrature) signal component (i.e., Q) 224. The digital signal processing module 210 is further arranged to perform mapping of the received complex input signal(s) 222, 224 to a first dimension digital control word (e.g. in-phase control word (IDPA_W) 212) and a second dimension digital control word (e.g. quadrature control word (QDPA_W) 214), and to output the first dimension and second dimension digital control words to power amplifier module (e.g., two-dimensional digital power amplifier, 2D-DPA) 230.

Figure 5:
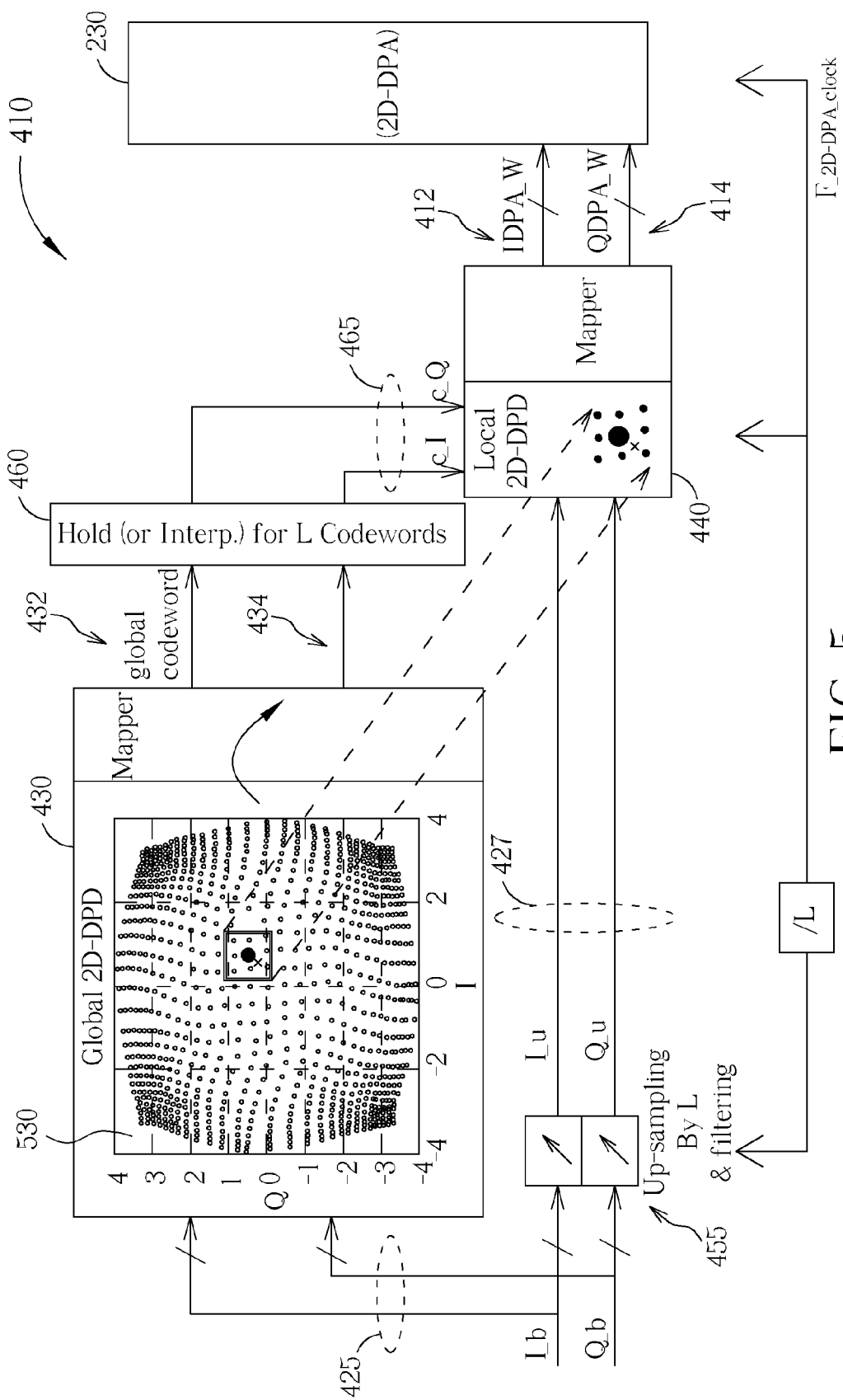
FIG. 5 illustrates a simplified block diagram of an example of a digital signal processing module of the radio frequency transmitter of FIG. 4.

The power amplifier module 230 comprises a first (in-phase) array of switch-mode power cells and, in the illustrated example, a second (quadrature) array of switch-mode power cells, as described in greater detail below with reference to FIG. 5. The power amplifier module 230 is arranged to receive the digital control words output by the digital signal processing module 210, and to generate an analogue RF signal for transmission over an RF interface, for example via antenna 102, based at least partly on the received (in-phase and quadrature) digital control words.

In this manner, the RF transmitter 200 comprises a complex signal based architecture, for example an IQ based architecture, and as such is suitable for both narrowband and wideband modulation input signals. This is in contrast to, for example, a digital polar architecture which is only suitable for narrowband modulated signals due to the inherent bandwidth expansion characteristics of the AM (amplitude modulation) and PM (phase modulation) input signals of a polar architecture. Furthermore, such an IQ based architecture avoids the need for implementing complex algorithms, such as the CORDIC (Coordinate rotation digital computer) algorithm typically required for digital polar architectures. In addition, the RF transmitter 200 also extends the digital domain through to the power amplifier module 230, thereby benefiting from the scalability and efficiency of digital components to a greater extent than conventional (linear PA) RF architectures. Furthermore, the RF transmitter 200 illustrated in FIG. 2 takes advantage of the efficiency of switch-mode power cells.

Switch-mode power cells typically exhibit a highly non-linear input-output relationship, in particular when output power is high. Accordingly, the digital signal processing module 210 is arranged to perform (two-dimensional) non-uniform mapping of the input signals 222, 224 (as described in greater detail below) to the digital control words 212, 214. In this manner, the two-dimensional non-uniform mapping of the input signals 222, 224 is able to provide pre-distortion of the input signals 222, 224, thereby enabling the non-linearity of the switch-mode power cells to be compensated for, also within the digital domain.

In some example embodiments of the present invention, digital pre-distortion is required to be performed with a sampling rate greater than that of the received complex input signal (for example in the region of three times that of the input signal) in order to preserve a certain spectrum at the output of the two-dimensional digital pre-distortion component (2D-DPD) 250. Accordingly, the digital signal processing module 210 of the RF transmitter 200 of FIG. 2 comprises an up-sampling & filtering component 240 arranged to perform up-sampling of the received complex input signal 222, 224 to increase the sample rate thereof to, for example, an input data rate of the power amplifier module 230. In addition, for some example embodiments the input to the power amplifier module 230 may comprise a 'sample and hold' operation. As such, so-called DAC images may be seen at the output of the power amplifier module 230 that are spaced from each other by the sampling frequency at the input of the power amplifier module 230. Accordingly, up-sampling of the input signal components 212, 214 enables the spacing of such images to be increased.

The digital signal processing module 210 of the RF transmitter 200 of FIG. 2 further comprises a digital pre-distortion component 250 arranged to perform the non-uniform mapping of the (up-sampled) input signals (i.e., I_u and Q_u) 242, 244 to the (in-phase and quadrature) digital control words 212, 214.

Figure 3:
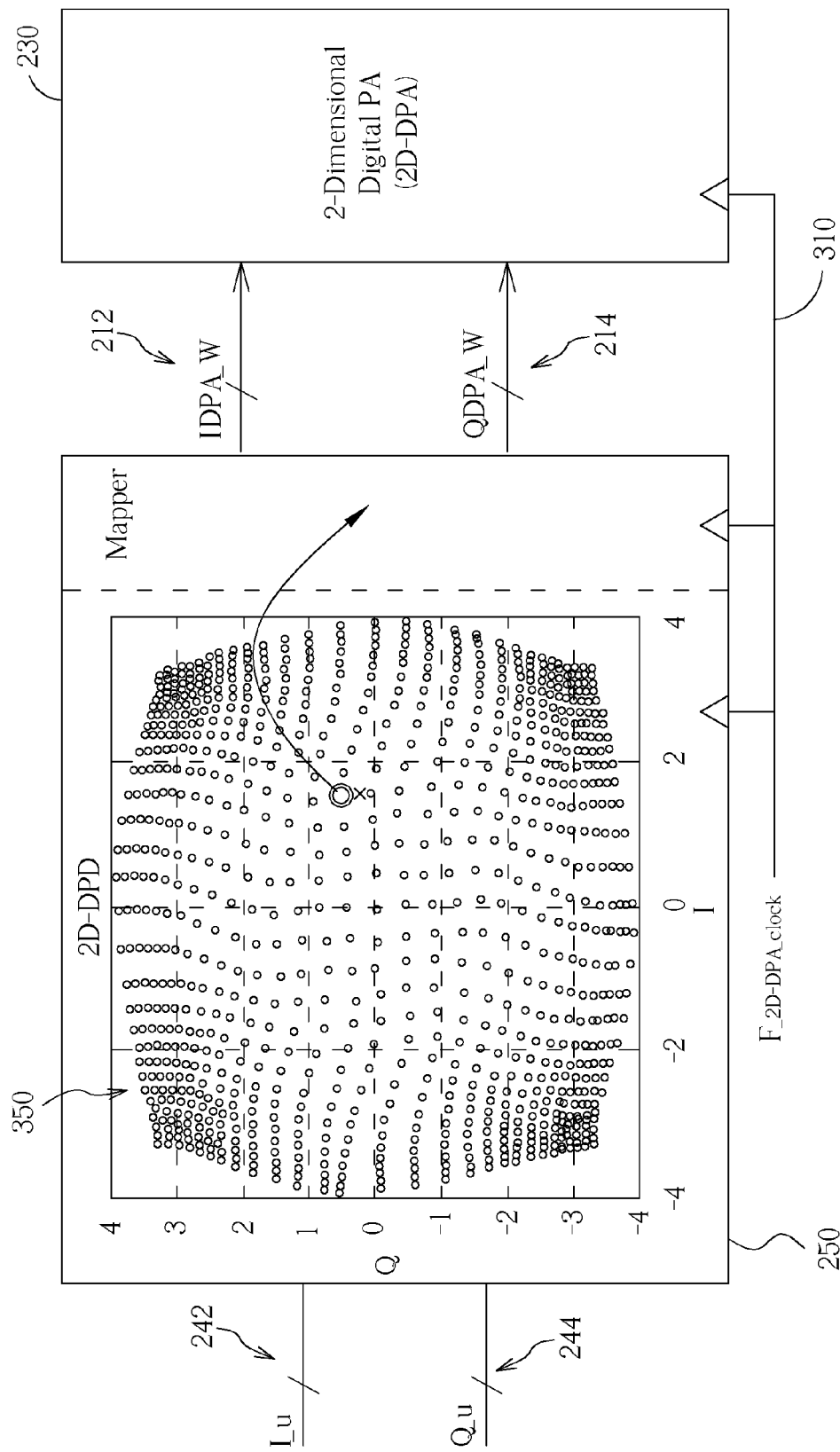
FIG. 3 illustrates a simplified block diagram of an example of a digital signal processing module of the radio frequency transmitter of FIG. 2.

For example, and as illustrated more clearly in FIG. 3, the digital signal processing module 210 may comprise a digital pre-distortion component 250 arranged to receive the up-sampled in-phase and quadrature components 242, 244 of the complex input signal, identify a closest matching predefined vector for the received complex input signal within a pre-distortion profile 350, and map the identified predefined vector to a set of digital control words to be output. In some examples, the pre-distortion profile 350 may be at least partly based on an input/output relationship for the power amplifier module 230, and in particular the pre-distortion profile 350 may be at least partly based on an input/output relationship for the switch-mode power cell arrays of the power amplifier module 230. In this manner, pre-distortion may be applied to the (up-sampled) in-phase and quadrature components 242, 244 that compensates for power amplifier module characteristics, and in particular the non-linear switch-mode power cell characteristics. Advantageously, utilising predefined/and/or mapped profile vector data in this manner enables different data to be provided according to the specific characteristics of different digital power amplifier modules. Accordingly, the digital signal processing module may be adapted for use within different transmitter applications.

For the example illustrated in FIG. 2 and FIG. 3, the digital pre-distortion component 250 is implemented within a feed-forward path (as opposed to a feedback path). In this manner, the digital pre-distortion component 250 is able to directly compensate for the non-linearity of the power amplifier module 230 for each input sample. Such sample-by-sample digital pre-distortion is more accurate and responsive than digital pre-distortion that is averaged across multiple input samples within a feedback path.

As also illustrated in FIG. 3, by up-sampling the received complex input signal 222, 224 to increase the sample rate thereof to an input data rate of the power amplifier module 230, the digital pre-distortion module component 250 and power amplifier module 230 may be provided with a common clock signal 310.

Thus, for the example illustrated in FIG. 2, the digital signal processing module 210 is arranged to receive the complex (IQ) input signal 222, 224, up-sample and non-uniformly map the received signal to digital control words 212, 214 such that pre-distortion is applied to compensate for the non-linear characteristics of the power amplifier module 230, and to output digital control words 212, 214 to the power amplifier module 230, wherein the digital control words 212, 214 are arranged to drive the power amplifier module 230 to output an analogue RF signal that represents the up-sampled complex (IQ) input signal 242, 244. In particular, a pre-distortion profile 350 used for mapping the up-sampled input signal components 242, 244 to the digital control words 212, 214 may be at least partly based on the input/output relationship for the switch-mode power cell arrays of the power amplifier module 230 to adaptively compensate for the non-linearities of the switch-mode power cell arrays. Thus, the digital signal processing module 210 of the illustrated example provides two dimensional (IQ) digital pre-distortion functionality within a feed-forward path of the RF transmitter 200.

The digital signal processing module 210 is required to run at a sufficiently high processing speed in order to obtain benefits from the over-sampling. However, it is also desirable for the digital signal processing module to have as low power consumption as possible. Accordingly, very high circuit speeds are not practical from a power consumption point of view. Since digital algorithms are limited by the availability of circuit speed, simple and effective digital algorithms are desirable from an implementation point of view in order to achieve the required high processing speeds whilst minimising power consumption.

Figure 4:
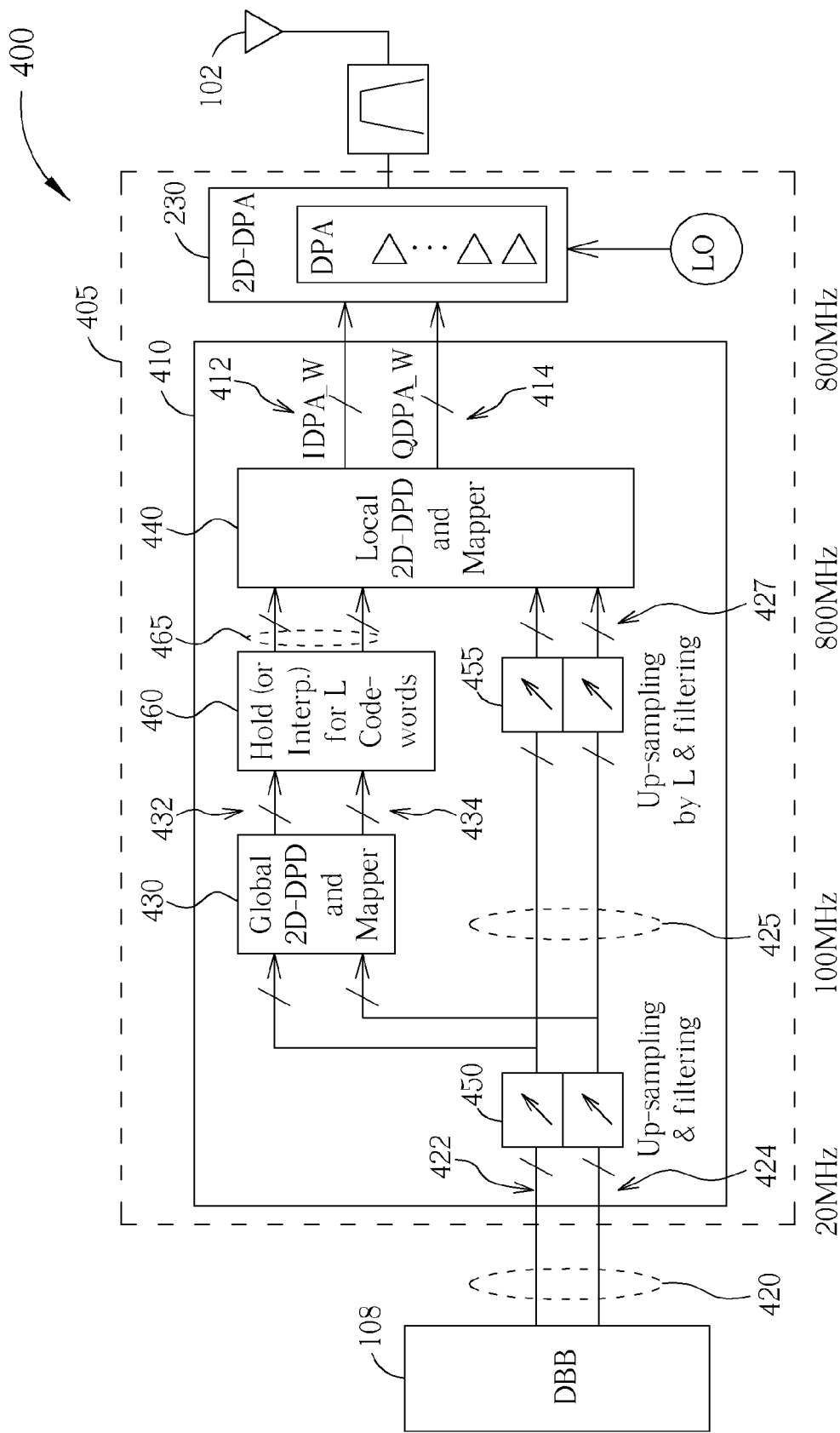
FIG. 4 illustrates a simplified block diagram of an example of a radio frequency transmitter according to some examples of the present invention.

Referring now to FIG. 4, there is illustrated a simplified block diagram of an example of an RF transmitter 400 adapted in accordance with some example embodiments of the present invention, such as may be implemented within the transmitter chain 107 of FIG. 1. For the illustrated example, the RF transmitter 400 is implemented within an integrated circuit device 405. The RF transmitter 400 of FIG. 4 comprises one or more digital signal processing modules, such as the digital signal processing module illustrated generally at 410. The (at least one) digital signal processing module 410 is arranged to receive a complex (in-phase/quadrature) digital input signal 420, successively apply pre-distortion to the received complex digital input signal 420 with a progressively finer granularity whilst simultaneously progressively increase a sampling rate of the received complex digital input signal 420, and output a first, in-phase, digital control word (IDPA_W) 412 and a second, quadrature, digital control word (QDPA_W) 414 for controlling at least one digital power amplifier component, such as the digital power amplifier module illustrated at 230, to generate an RF signal representative of the received complex digital input signal 420.

In this manner, at least some of the processing of the digital input signal 420 may be performed at lower circuit speeds, thereby enabling the power consumption required for such processing to be reduced, and simplifying algorithms required for finer granularity processing required to be performed at higher processing speeds, such as at an input data rate of the digital power amplifier module 230.

For example, and as illustrated in FIG. 4, the digital signal processing module 410 comprises a plurality of digital pre-distortion components arranged to sequentially apply pre-distortion to the received complex digital input signal 420 with a progressively finer granularity as the sampling rate of the received complex digital input signal 420 is simultaneously progressively increased. Specifically for the illustrated example, and as illustrated in greater detail in FIG. 5, the digital signal processing module 410 comprises a first digital pre-distortion component (denoted by 'Global 2D-DPD and Mapper') 430 arranged to receive the digital input signal 425 and pre-distortion profile information 530 for the digital power amplifier 230, and output at least an indication of a sub-set of the pre-distortion profile information 530 for the digital power amplifier module 230 to which the received complex digital input signal relates.

In particular for the illustrated example, the digital signal processing module 410 is arranged to receive a complex digital input signal 420 comprising a first, in-phase, component 422 and a second, quadrature, component 424, and to output a first, in-phase, digital control word 412 and a second, quadrature, digital control word 414 for controlling the digital power amplifier module 230 to generate a complex RF signal representative of the received complex digital input signal 420. The digital signal processing module 410 of FIG. 4 comprises a first up-sampling component 450 arranged to perform up-sampling of the received complex input signal components 422, 424 to increase the sample rate thereof from a baseband data rate of, say, 20 MHz to, for example, an intermediate data rate of, say, 100 MHz at 425. The first digital pre-distortion component 430 is arranged to receive the up-sampled digital input signal components 425 comprising the intermediate data rate, and pre-distortion profile information 530 (see FIG. 5), and to identify a closest matching predefined vector for the received complex digital input signal components 425 within the pre-distortion profile information 530 and map the identified predefined vector to, for example, a set of digital control words (i.e., global codewords) 432, 434 to provide an indication of a reduced sub-set of the pre-distortion profile information 530. In some examples of the present invention, the pre-distortion profile information 530 may be at least partly based on an input/output relationship for the power amplifier module 230, and in particular the pre-distortion profile information 530 may be at least partly based on an input/output relationship for the switch-mode power cell arrays of the power amplifier module 230. In this manner, pre-distortion may be applied to the up-sampled input signal components 425 that compensates for power amplifier module characteristics, and in particular the non-linear switch-mode power cell characteristics, with a first (coarse) granularity.

The digital signal processing module 410 further comprises at least one further pre-distortion component arranged to receive the digital input signal comprising a sampling rate greater than that of a preceding pre-distortion component and an indication of a sub-set of the pre-distortion profile information for the digital power amplifier output by the preceding pre-distortion component, and to output at least an indication of a reduced sub-set of the pre-distortion profile information for the digital power amplifier component to which the received complex digital input signal relates.

In particular for the illustrated example, the digital signal processing module 410 of FIG. 4 comprises a further up-sampling component 455 arranged to perform further up-sampling of the received digital input signal (i.e., I_b and Q_b shown in FIG. 5) 425 to further increase the sample rate thereof from the intermediate data rate of, for the illustrated example, 100 MHz to, for example, an input data rate of the power amplifier module 230 of, say, 800 MHz. The digital signal processing module 410 further comprises a final pre-distortion component (denoted by 'Local 2D-DPD and Mapper') 440 arranged to receive the further up-sampled digital input signal (e.g., I_u and Q_u shown in FIG. 5) 427 and the set of digital control words 432, 434 indicating a reduced sub-set of the pre-distortion profile information 530 output by the first pre-distortion component 430. The final pre-distortion component 440 is further arranged to output an indication of a reduced sub-set of the pre-distortion profile information for the digital power amplifier component 230 in the form of the digital control words 412, 414 for controlling the digital power amplifier module 230 to generate an RF signal representative of the received complex digital input signal 420.

In this manner, the digital input signal 420 is progressively up-sampled, with pre-distortion being progressively applied at each up-sampled stage. Thus, for the illustrated example, the digital signal processing module 410 is arranged to apply a first stage of coarse granularity pre-distortion to the input signal at the intermediate data rate of 100 MHz, and a second stage of finer granularity pre-distortion to the input signal at the power amplifier module input data rate of 800 MHz. In addition for the illustrated example, the signal processing module 410 further comprises at least one interpolation component (denoted by 'Hold (or Interp.) for L Codewords') 460 operably coupled between sequential pre-distortion components (i.e., 430 and 440), and arranged to receive at a first data rate indications of a sub-set of the pre-distortion profile information output by a preceding pre-distortion component, perform interpolation of the indications of a sub-set of the pre-distortion profile information output by a preceding pre-distortion component, and output at an increased data rate interpolated indications of a sub-set of the pre-distortion profile information to a successive pre-distortion component at an increased sampling rate. Specifically for the illustrated example, the interpolation component 460 is arranged to receive at the intermediate data rate of the up-sampled signal at 425 (i.e. at 100 MHz) the set of digital control words 432, 434 indicating a reduced sub-set of the pre-distortion profile information 530 output by the first pre-distortion component 430, and to output at the increased input data rate of the power amplifier module 230 (i.e. at 800 MHz) a set of digital control words (i.e., c_I and c_Q shown in FIG. 5) 465 providing interpolated indications of a sub-set of the pre-distortion profile information. In this manner, the second (final) pre-distortion component 440 is provided with interpolated indications of a sub-set of the pre-distortion profile information at the same (up-sampled) data rate as the input signal 427 received thereby.

For the example illustrated in FIG. 4, the digital signal processing module 410 has been illustrated as comprising a first (global) pre-distortion component 430 and a second (local) pre-distortion component 440 arranged to up-sample and successively apply pre-distortion to the input signal 420 in two stages for ease of understanding. However, it will be appreciated that such a digital signal processing module 410 may comprise any suitable number of such cascaded pre-distortion components.

Figure 6:
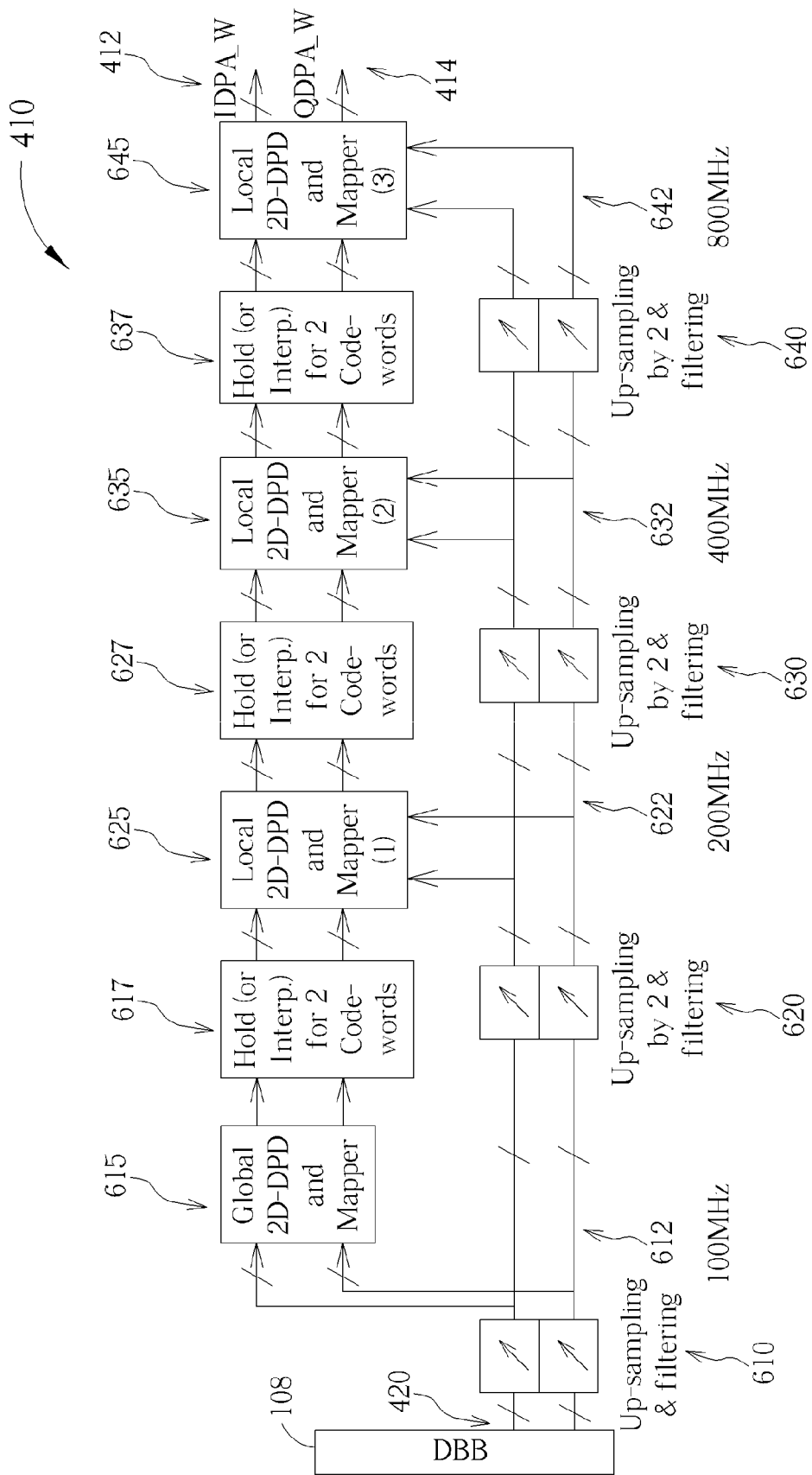
FIG. 6 illustrates a simplified block diagram of an alternative example of a digital signal processing module of the radio frequency transmitter of FIG. 4.

For example, and as illustrated in FIG. 6, the digital signal processing module 600 is an alternative design of the digital signal processing module 410, and may comprise an N-stage progressive architecture comprising a first up-sampling and pre-distortion stage comprising a first up-sampling component 610 and a first digital pre-distortion component 615. The first up-sampling component 610 is arranged to perform up-sampling of the received complex input signal 420 to increase the sample rate thereof from a baseband data rate of, say, 20 MHz to a first intermediate data rate of, say, 100 MHz at 612. The first digital pre-distortion component 615 is arranged to receive the digital input signal at the first intermediate data rate 612 output by the first up-sampling component 610, and pre-distortion profile information 530 for the digital power amplifier 230, and output set of digital control words indicating a sub-set of the pre-distortion profile information 530 for the digital power amplifier module 230 to which the received complex digital input signal relates.

The digital signal processing module 600 comprising the N-stage progressive architecture of FIG. 6 further comprises N−1 further up-sampling and pre-distortion stages. In particular for the illustrated example, the digital signal processing module 600 comprises a 4-stage progressive architecture comprising three further up-sampling and pre-distortion stages.

A second up-sampling and pre-distortion stage comprises a second up-sampling component 620 and a second digital pre-distortion component 625. The second up-sampling component 620 is arranged to perform further up-sampling of the received up-sampled complex input signal to increase the sample rate thereof from the first intermediate data rate of, in the illustrated example, 100 MHz to a second intermediate data rate of, say, 200 MHz at 622. The second digital pre-distortion component 625 is arranged to receive the digital input signal at the second intermediate data rate 622 output by the second up-sampling component 620, and pre-distortion profile information 530 for the digital power amplifier module 230, and output set of digital control words indicating a reduced sub-set of the pre-distortion profile information 530 for the digital power amplifier module 230 to which the received complex digital input signal relates.

A third up-sampling and pre-distortion stage comprises a third up-sampling component 630 and a third digital pre-distortion component 635. The third up-sampling component 630 is arranged to perform further up-sampling of the received up-sampled complex input signal to increase the sample rate thereof from the second intermediate data rate of, in the illustrated example, 200 MHz to a third intermediate data rate of, say, 400 MHz at 632. The third digital pre-distortion component 635 is arranged to receive the digital input signal at the third intermediate data rate 632 output by the third up-sampling component 630, and pre-distortion profile information 530 for the digital power amplifier module 230, and output set of digital control words indicating a further reduced sub-set of the pre-distortion profile information 530 for the digital power amplifier module 230 to which the received complex digital input signal relates.

A fourth (and in the illustrated example final) up-sampling and pre-distortion stage comprises a fourth up-sampling component 640 and a fourth digital pre-distortion component 645. The fourth up-sampling component 640 is arranged to perform further up-sampling of the received up-sampled complex input signal to increase the sample rate thereof from the third intermediate data rate of, in the illustrated example, 400 MHz to an input data rate of the power amplifier module 230 of, say, 800 Mhz at 642. The fourth digital pre-distortion component 645 is arranged to receive the digital input signal at the power amplifier module input data rate 642 output by the fourth up-sampling component 640, and pre-distortion profile information 530 for the digital power amplifier module 230, and output set of digital control words indicating a still further reduced sub-set of the pre-distortion profile information for the digital power amplifier module 230 in the form of the digital control words 412, 414 for controlling the digital power amplifier module 230 to generate an RF signal representative of the received complex digital input signal 420.

The digital signal processing module 600 comprising the N-stage progressive architecture of FIG. 6 further comprises a plurality of interpolation components 617, 627, 637 operably coupled between sequential digital pre-distortion components 615, 625, 635, 645.

A first interpolation component 617 is operably coupled between the first digital pre-distortion component 615 and the second digital pre-distortion component 625, and arranged to receive at the first intermediate data rate of the digital input signal 612 output by the first up-sampling component 610 (i.e. at 100 MHz) the set of digital control words indicating a sub-set of the pre-distortion profile information 530 output by the first pre-distortion component 615, and to output at the second intermediate data rate of the digital input signal 622 output by the second up-sampling component 620 (i.e. at 200 MHz) a set of interpolated digital control words indicating a sub-set of the pre-distortion profile information 530.

A second interpolation component 627 is operably coupled between the second digital pre-distortion component 625 and the third digital pre-distortion component 635, and arranged to receive at the second intermediate data rate of the digital input signal 622 output by the second up-sampling component 620 (i.e. at 200 MHz) the set of digital control words indicating a reduced sub-set of the pre-distortion profile information 530 output by the second pre-distortion component 625, and to output at the third intermediate data rate of the digital input signal 632 output by the third up-sampling component 630 (i.e. at 400 MHz) a set of interpolated digital control words indicating a reduced sub-set of the pre-distortion profile information 530.

A third interpolation component 637 is operably coupled between the third digital pre-distortion component 635 and the fourth digital pre-distortion component 645, and arranged to receive at the third intermediate data rate of the digital input signal 632 output by the third up-sampling component 630 (i.e. at 400 MHz) the set of digital control words indicating a reduced sub-set of the pre-distortion profile information 530 output by the third pre-distortion component 635, and to output at the input data rate of the power amplifier module 230 output by the fourth up-sampling component 640 (i.e. at 800 MHz) a set of interpolated digital control words indicating a further reduced sub-set of the pre-distortion profile information 530.

Thus, a series of progressively more accurate pre-distortion stages may be implemented at progressively faster processing speeds.

Figure 7:
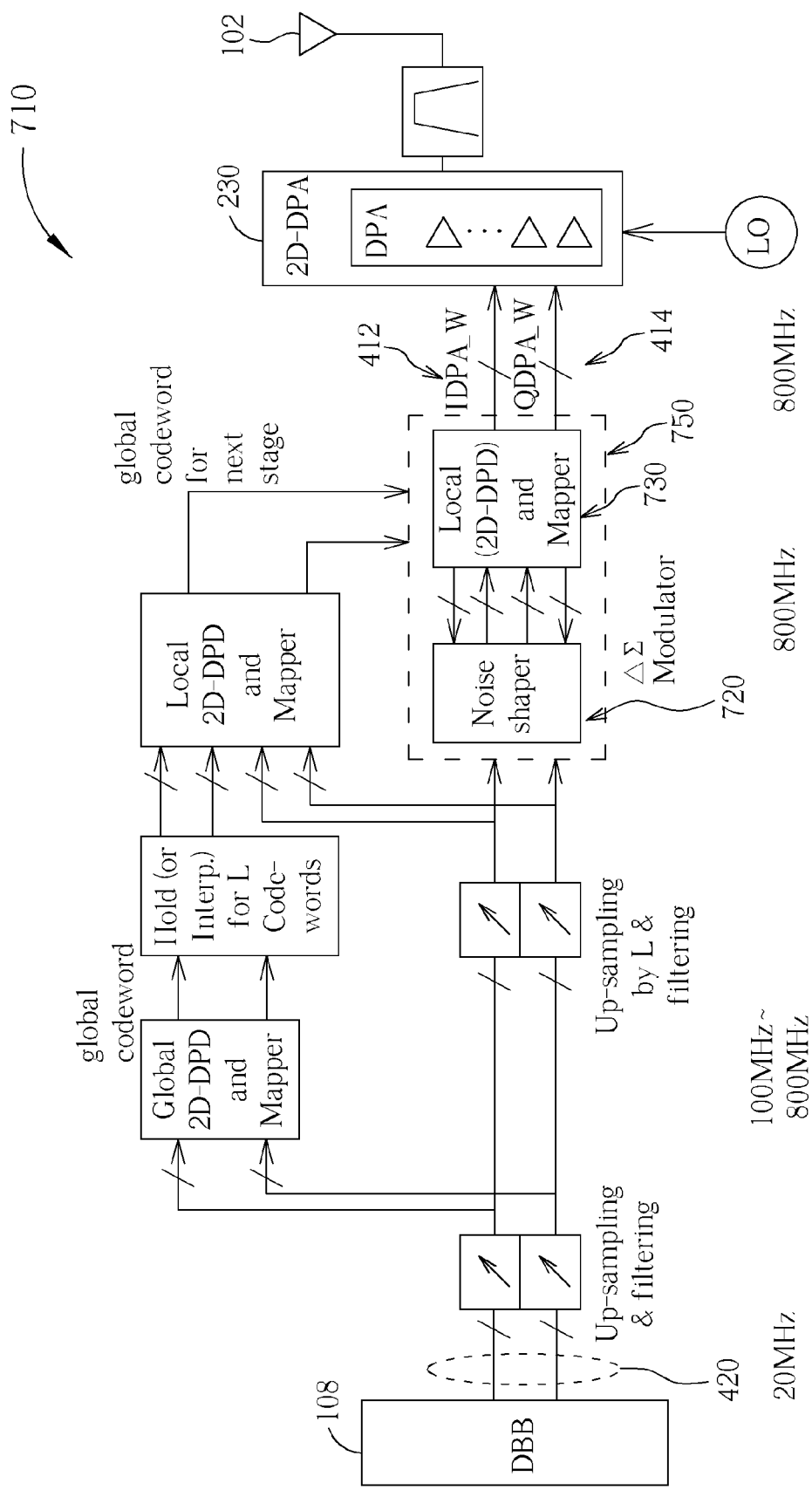
FIG. 7 illustrates a simplified block diagram of an alternative example of a radio frequency transmitter according to some examples of the present invention.

Referring now to FIG. 7 there is illustrated an RF architecture comprising an alternative example of a digital signal processing module 710. The digital signal processing module 710 of FIG. 7 further comprises a noise shaping component 720. The noise shaping component 720 is arranged to receive the complex input signal and at least one feedback signal from at least one digital pre-distortion component, apply noise shaping to the complex input signal based at least partly on the at least one feedback signal, and output at least one noise shaped complex input signal. Specifically for the illustrated example, the noise shaping component 720 is arranged to receive the complex input signal 420 up-sampled to an input data rate of the power amplifier module 230 and a complex feedback signal from a final digital pre-processing component 730, and to output a noise shaped complex input signal to the final digital pre-processing component 730. The final digital pre-distortion component 730 is arranged to receive the noise shaped complex input signal, perform non-uniform mapping of the noise shaped complex input signal and to output a set of digital control words 412, 414 for controlling the digital power amplifier component 230 to generate an RF signal representative of the received complex digital input signal 420.

In this manner, noise shaping of the complex input signal 420 may be performed within the digital domain, and within the feed-forward path, prior to the non-uniform mapping to the digital control words 412, 414, thereby enabling noise shaping to be maintained at the far-out region from the carrier, thus improving the spectrum at the desired far-out frequency band. In particular, it is contemplated that such noise shaping may be implemented through a configurable and/or programmable noise transfer function. In this manner, the RF transmitter may be configured and/or programmed to perform required noise shaping to meet stringent co-existence requirements of a plurality of different wireless standards.

As illustrated in FIG. 7, the noise shaping component 720 and the final digital pre-distortion component 730 may be arranged to form a delta-sigma modulator (ΔΣ Modulator), as illustrated at 750. In this manner, quantization noise introduced by the various digital pre-distortion components within the digital signal processing module 710 may be compensated for. As illustrated in greater detail in FIG. 8, the up-sampled complex input signal comprises a two-dimensional vector x(n) 810. The I-value and Q-value of x(n) 810 may be within a value range of, say, −4095 to +4095, respectively. Therefore a 13-bit binary word is required to represent x(n) 810 to cover the whole range of x(n) 810. In a conventional delta-sigma modulator, x(n) 810 is directly input to an adder of the noise shaper inside the delta-sigma modulator. This would require at least a 13-bit adder. Since the adder is also inside the feedback loop and a 13-bit adder takes time to effect the additions, this would have a detrimental impact on the speed of the whole conventional delta-sigma modulator, i.e. the operating clock frequency for a conventional delta-sigma modulator in this case would not be able to be sufficiently high. Furthermore, since there are many bits in the adder, the conventional delta-sigma modulator also consumes a lot of power.

Figure 8:
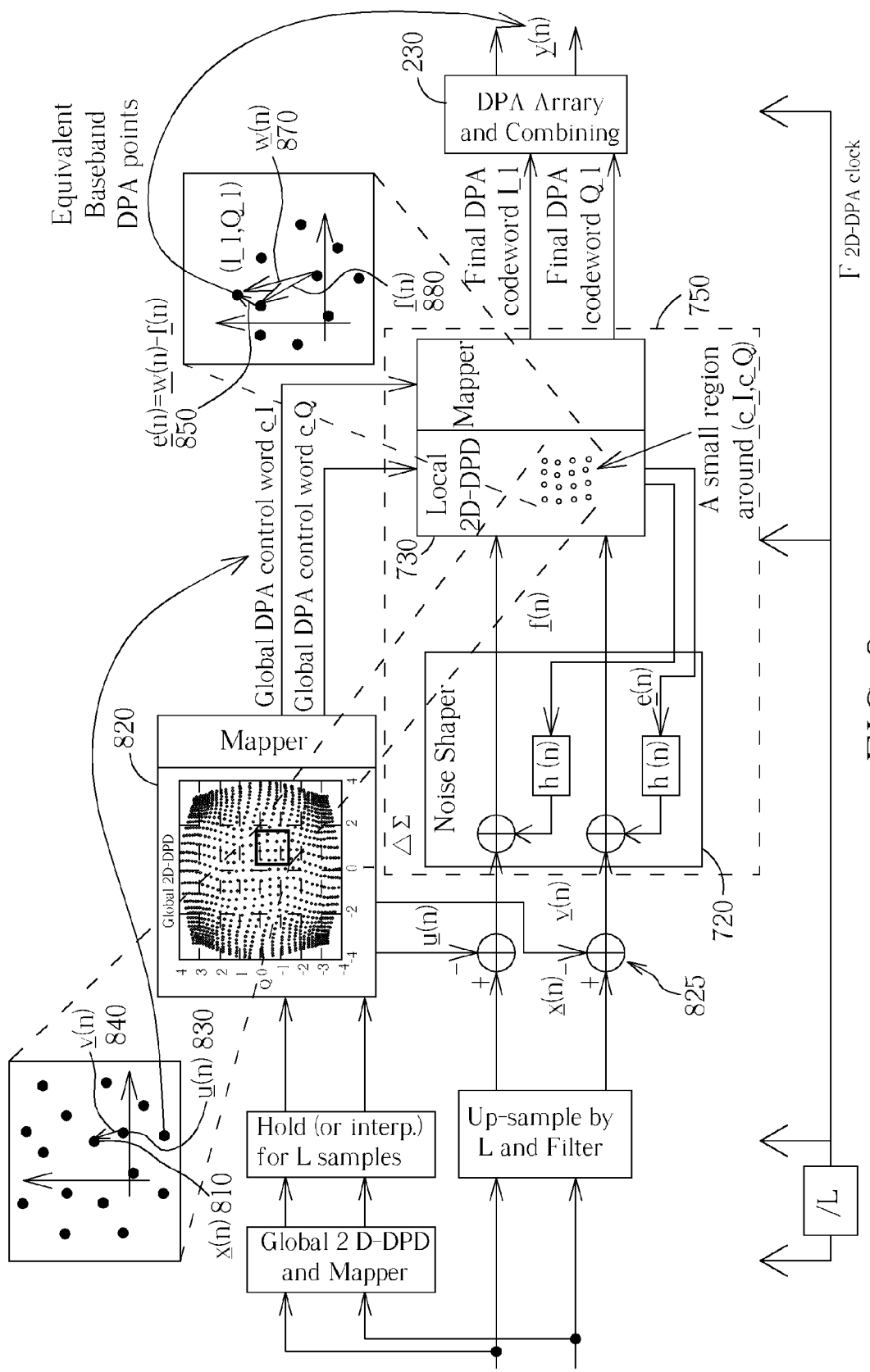
FIG. 8 illustrates a simplified block diagram of an example of a digital signal processing module of the radio frequency transmitter of FIG. 4.

However, for the example illustrated in FIG's 7 and 8, the complex input signal has previously been mapped to a pre-defined DPA point u(n), illustrated generally at 830 within the two-dimensional profile for the digital power amplifier (e.g. within previous digital pre-distortion components, such as the global digital pre-distortion component (Global 2D-DPD) 820 illustrated in FIG. 8). For the illustrated example, rather than using the vector x(n) 810 for the up-sampled complex input signal as the input to the adder of the noise shaper 720 within the delta-sigma modulator 750, as would be the case for conventional delta-sigma modulator, the difference between x(n) 810 and u(n) 830 is taken (by way of an adder 835 outside the local delta-sigma modulator 750 in the illustrated example), which results in the vector v(n) 840. The vector v(n) 840 is then used as the input to the adder of the noise shaper 720 inside the delta-sigma modulator 750. The I-value and Q-value of v(n) 840 is usually in the range of, say, −7 to +7, and thus only a 4-bit adder is required for the noise shaper 720 inside the delta-sigma modulator 750. Thus, only a 4-bit adder is present inside the feedback loop, thereby enabling the speed of the whole local delta-sigma modulator 750 with embedded two-dimensional digital pre-distortion to be drastically increased. Also, due to the fewer number of bits required in the adder of the noise shaper 720, the power consumption of the local delta-sigma modulator 750 with embedded two-dimensional digital pre-distortion can be significantly reduced.

With regard to the noise shaping applied by the local delta-sigma modulator 750 as compared with a conventional delta-sigma modulator, suppose the feedback for both the local delta-sigma modulator 750 of the illustrated example and conventional delta-sigma modulator is initially e(n), as illustrated at 850 in FIG. 8. For a conventional delta-sigma modulator, a two-dimensional vector f(n) output by the noise shaper of the delta-sigma modulator may be expressed as $f(n)=x(n)+h(n)*e(n)$, where * denotes component-wise convolution, since x(n) 810 is directly applied to the adder of the noise shaper inside conventional delta-sigma modulator. Conversely, for local delta-sigma modulator 750 of the illustrated example, the two-dimensional vector f(n), illustrated at 880, output by the noise shaper 720, may be expressed as $f(n)=v(n)+h(n)*e(n)=(x(n)-u(n))+h(n)*e(n)$ since v(n) 840 is directly applied to the adder of the noise shaper 720 inside the local delta-sigma modulator 750.

Comparative embedded pre-distortion components within the local delta-sigma modulator 750 and a conventional delta-sigma modulator will map the same input vector x(n) 810 to the same point within the two-dimensional profile for the digital power amplifier, since the resulting mapped vector y(n) is the closest to the vector f(n), where f(n) is a noise-shaped version of x(n). For example, for the next clock cycle, a new error vector e(n) for the conventional delta-sigma modulator is $e(n)=y(n)-(\text{Conventional } f(n))$; y(n) comprising the output vector illustrated generally at 860. The new error vector e(n) 850 for the local delta-sigma modulator 750 is $e(n)=w(n)-(\text{Local } f(n))$; w(n) being indicated generally at 870. Both feedback values e(n) correspond to respective vectors between the vector f(n) output by the noise shaper of the delta-sigma modulator and a DPA point within the two-dimensional profile for the digital power amplifier profile represented by the vector y(n) for the conventional delta-sigma modulator, or w(n) for the local delta-sigma modulator 750 of the illustrated example output by the power amplifier module (denoted by 'DPA Array and Combining' in FIG. 8) 230. As such the feedback values e(n) for both the local delta-sigma modulator 750 of the illustrated example and a conventional delta-sigma modulator will comprise the same vector. This same vector will be used as the feedback e(n) in both the local delta-sigma modulator 750 and the conventional delta-sigma modulator. Thus, both the local delta-sigma modulator 750 of the illustrated example and a conventional delta-sigma modulator realize the same noise shaping.

Notably, substituting the equation:
Conventional $f(n)=x(n)+h(n)*e(n)$ into the equation:

$$e(n)=y(n)-(\text{Conventional } f(n)), \text{ gives}$$

$$y(n)=x(n)+(\delta(n)+h(n)*e(n),$$

where: y(n) is the (quantized) digital output 860 of the power amplifier component, x(n) is the input signal, and e(n) is the quantization error, $(\delta(n)+h(n))$ realizes the shaping on the quantization error e(n).

By changing h(n), it is possible to realize the desired noise shaping. Since the local delta-sigma modulator 750 with embedded two-dimensional digital pre-distortion takes v(n) 840 as an input, which has fewer bits, the local delta-sigma modulator 750 with embedded two-dimensional digital pre-distortion consumes less power and can operate at higher clock frequency.

Thus, for the illustrated example, the noise shaping component 720 and the final digital pre-distortion component 730 may be arranged to form a 'local' delta-sigma modulator 750 that comprises the final pre-distortion component 730 embedded therein, whereby delta-sigma modulation need only be performed for a localised sub-set of the pre-distortion profile information. Such a local delta-sigma modulator 750 comprising the final pre-distortion component 730 embedded therein is able to achieve substantially the same noise shaping and digital pre-distortion as a conventional delta-sigma modulator with an embedded pre-distortion component, but with significantly reduced power consumption through bit-width reduction in the noise shaper 720. Furthermore, by applying pre-distortion to the received digital input signal with a progressively finer granularity, as herein described, and implementing such a local delta-sigma modulator 750 comprising the final pre-distortion component 730 embedded therein may also enable the clock frequency that the delta-sigma modulator 750 is able to operate at to be increased.

Figure 9:
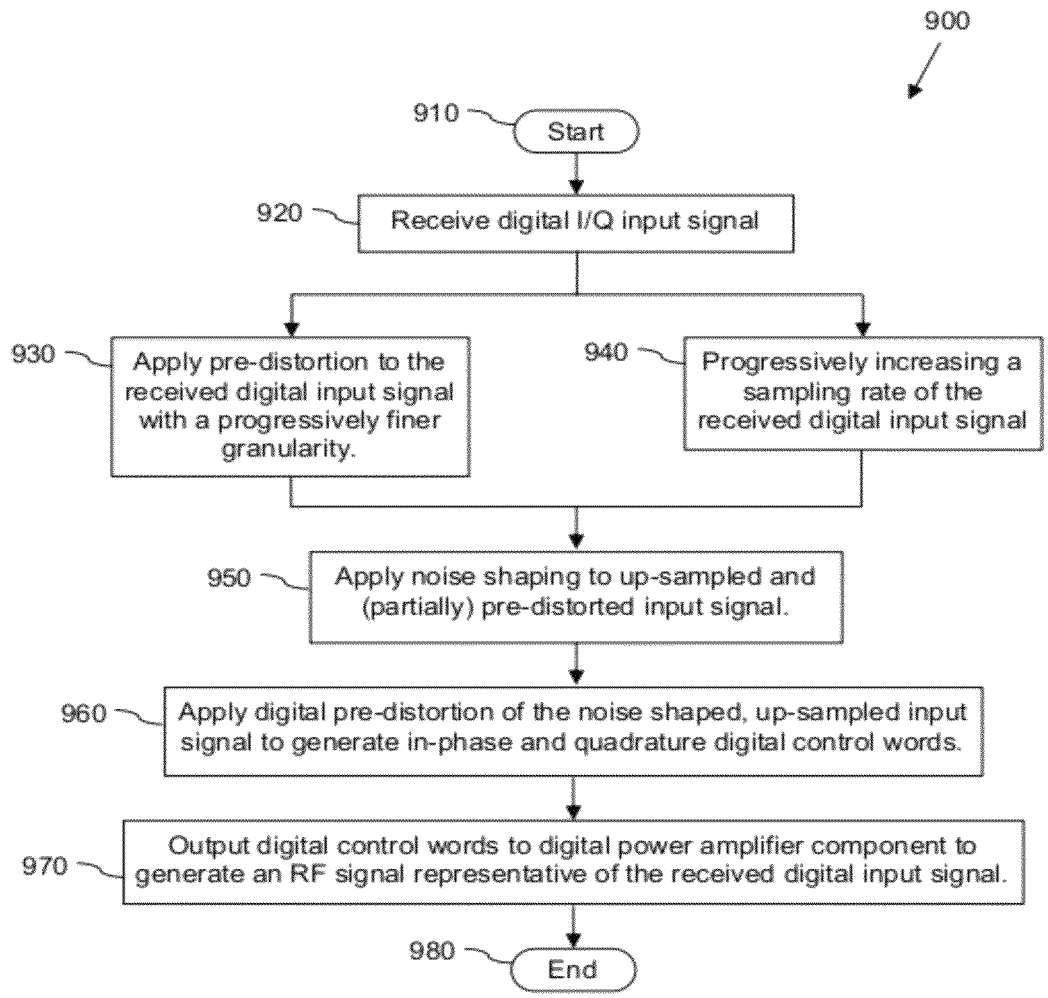
FIG. 9 illustrates a simplified flowchart of an example of a method for generating an analogue RF signal for transmission over an RF interface according to some example embodiments of the present invention.

Referring now to FIG. 9, there is illustrated a simplified flowchart 900 of an example of a method for generating an analogue RF signal for transmission over an RF interface. The method of FIG. 9 starts at step 910, and moves on to step 920 with the receipt of digital IQ input signal comprising information to be transmitted over the RF interface. Next, at step 930, pre-distortion is applied to the received complex digital input signal with a progressively finer granularity. Substantially simultaneously, at step 940, a sampling rate of the received complex digital input signal is progressively increased. Noise shaping may the then be applied to the up-sampled input signal, at 950, for example based on feedback from a final digital pre-distortion stage. Digital pre-distortion of the noise shaped, up-sampled input signal may then be performed based on a non-uniform pre-distortion profile for the power amplifier module to generate in-phase and quadrature digital control words, at step 960. The digital control words for controlling the digital power amplifier component are then output, at step 970, and the method ends at step 980.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) transmitter comprising at least one digital signal processing module, the at least one digital signal processing module being arranged to:
    receive a complex digital input signal;
    successively apply pre-distortion to the received complex digital input signal with a progressively finer granularity;
    simultaneously progressively increase a sampling rate of the received complex digital input signal;
    identify a matching predefined vector within pre-distortion profile information for the received complex digital input signal, and
    map the identified predefined vector to in-phase and quadrature digital control words that serve as an indication of a sub-set of the pre-distortion profile information for the digital power amplifier component to which the received complex digital input signal relates; and
    output the in-phase and quadrature digital control words for controlling at least one digital power amplifier component to generate an RF signal representative of the received complex digital input signal.

2. The RF transmitter of claim 1 wherein the at least one digital signal processing module is arranged to successively apply two-dimensional pre-distortion to the received complex digital input signal with a progressively finer granularity.

3. The RF transmitter of claim 1 wherein the at least one digital signal processing module comprises a plurality of digital pre-distortion components arranged to sequentially apply pre-distortion to the received complex digital input signal with a progressively finer granularity as the sampling rate of the received complex digital input signal is simultaneously progressively increased.

4. The RF transmitter of claim 3 wherein the at least one digital signal processing module comprises a first digital pre-distortion component arranged to receive the complex digital input signal comprising a first sampling rate and the pre-distortion profile information for the digital power amplifier.

5. The RF transmitter of claim 4 wherein the at least one digital signal processing module comprises at least one further pre-distortion component arranged to receive the complex digital input signal comprising a sampling rate greater than that of a preceding pre-distortion component and an indication of a sub-set of the pre-distortion profile information for the digital power amplifier output by the preceding pre-distortion component; and output at least an indication of a reduced sub-set of the pre-distortion profile information for the digital power amplifier component to which the received complex digital input signal relates.

6. The RF transmitter of claim 4 wherein the at least one digital signal processing module comprises a final pre-distortion component arranged to:
    receive the complex digital input signal comprising a sampling rate greater than that of a preceding pre-distortion component and an indication of a sub-set of the pre-distortion profile information for the digital power amplifier output by the preceding pre-distortion component; and
    output an indication of a reduced sub-set of the pre-distortion profile information for the digital power amplifier component to which the received complex digital input signal relates comprising the in-phase and quadrature digital control words for controlling at least one digital power amplifier component to generate an RF signal representative of the received complex digital input signal.

7. The RF transmitter of claim 3 wherein the at least one digital processing module further comprises at least one noise shaping component arranged to receive the complex digital input signal and at least one feedback signal from the at least one digital pre-distortion component, apply noise shaping to the complex digital input signal based at least partly on the at least one feedback signal, and output at least one noise shaped complex digital input signal.

8. The RF transmitter of claim 7 wherein the at least one digital pre-distortion component is arranged to receive the at least one noise shaped complex digital input signal, perform two-dimensional non-uniform mapping of the at least one noise shaped complex digital input signal to the in-phase and quadrature digital control words, and to output the in-phase and quadrature digital control words for controlling the digital power amplifier component to generate an RF signal representative of the received complex digital input signal.

9. The RF transmitter of claim 8 wherein the at least one noise shaping component and the at least one digital pre-distortion component form at least part of a delta sigma modulator.

10. The RF transmitter of claim 9 wherein the at least one digital signal processing module comprises a local delta-sigma modulator comprising a final pre-distortion component for performing two-dimensional digital pre-distortion embedded therein.

11. The RF transmitter of claim 3 wherein each digital pre-distortion component is arranged to:
    receive the complex digital input signal;
    identify a closest matching predefined vector for the received complex digital input signal within the pre-distortion profile information; and
    map the identified predefined vector to the in-phase and quadrature digital control words to provide the indication of a reduced sub-set of the pre-distortion profile information for the digital power amplifier component to which the received complex digital input signal relates.

12. The RF transmitter of claim 3 wherein the pre-distortion profile information is at least partly based on an input/output relationship for the power amplifier module.

13. The RF transmitter of claim 3 wherein the signal processing module further comprises at least one interpolation component operably coupled between sequential pre-distortion components, and arranged to:
    receive at a first data rate indications of a sub-set of the pre-distortion profile information output by apreceding pre-distortion component;
    perform interpolation of the multiple indications of a sub-set of the pre-distortion profile information output by a preceding pre-distortion component; and
    output at an increased data rate an interpolated indication of a sub-set of the pre-distortion profile information to a successive pre-distortion component.

14. An integrated circuit device comprising at least one digital signal processing module arranged to:

receive a complex digital input signal;
successively apply pre-distortion to the received complex digital input signal with a progressively finer granularity;
simultaneously progressively increase a sampling rate of the received complex digital input signal; and
identify a matching predefined vector within pre-distortion profile information for the received complex digital input signal, and
map the identified predefined vector to in-phase and quadrature digital control words that serve as an indication of a sub-set of the pre-distortion profile information for the digital power amplifier component to which the received complex digital input signal relates; and
output the in-phase and quadrature digital control words for controlling at least one digital power amplifier component to generate an RF signal representative of the received complex digital input signal.

15. A wireless communication unit comprising:
at least one digital signal processing module arranged to:
  receive a complex digital input signal;
  successively apply pre-distortion to the received complex digital input signal with a progressively finer granularity;
  simultaneously progressively increase a sampling rate of the received complex digital input signal; and
  identify a matching predefined vector within pre-distortion profile information for the received complex digital input signal, and
  map the identified predefined vector to in-phase and quadrature digital control words that serve as an indication of a sub-set of the pre-distortion profile information for the digital power amplifier component to which the received complex digital input signal relates; and
at least one digital power amplifier component arranged to receive the in-phase quadrature digital control words that control a generation of an RF signal representative of the received complex digital input signal.

16. A method of generating a radio frequency signal for transmission over a radio frequency (RF) interface, the method comprising:
receiving a complex digital input signal;
successively applying pre-distortion to the received complex digital input signal with a progressively finer granularity;
simultaneously progressively increasing a sampling rate of the received complex digital input signal;
identifying a matching predefined vector within pre-distortion profile information for the received complex digital input signal, and
mapping the identified predefined vector to in-phase and quadrature digital control words that serve as an indication of a sub-set of the pre-distortion profile information for the digital power amplifier component to which the received complex digital input signal relates; and
outputting the in-phase and quadrature digital control words for controlling at least one digital power amplifier component to generate an RF signal representative of the received complex digital input signal.

* * * * *